US010855259B1

(12) United States Patent
Panas et al.

(10) Patent No.: US 10,855,259 B1
(45) Date of Patent: Dec. 1, 2020

(54) SYSTEMS AND METHODS FOR MICROMECHANICAL DISPLACEMENT-BASED LOGIC CIRCUITS

(71) Applicants: Lawrence Livermore National Security, LLC, Livermore, CA (US); The Regents of the University of California, Oakland, CA (US)

(72) Inventors: Robert Matthew Panas, Dublin, CA (US); Logan Bekker, Pleasanton, CA (US); Julie Mancini, Livermore, CA (US); Andrew Pascall, Livermore, CA (US); Jonathan Hopkins, Los Angeles, CA (US); Amin Farzaneh, Woodland Hills, CA (US)

(73) Assignees: Lawrence Livermore National Security, LLC, Livermore, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 16/808,629

(22) Filed: Mar. 4, 2020

(51) Int. Cl.
*H03K 3/037* (2006.01)
*B81B 3/00* (2006.01)
*H03K 3/013* (2006.01)

(52) U.S. Cl.
CPC ......... *H03K 3/0375* (2013.01); *B81B 3/0097* (2013.01); *H03K 3/013* (2013.01); *B81B 2201/0292* (2013.01)

(58) Field of Classification Search
CPC .................................................. H03K 3/0375
See application file for complete search history.

(56) References Cited

U.S. PATENT DOCUMENTS 5,559,686 A * 9/1996 Patel ................... H02M 7/49
363/43
8,985,250 B1 * 3/2015 Lussier ................. B62D 55/12
180/9.1

(Continued)

OTHER PUBLICATIONS

Raney, Jordan R. et al. Stable propagation of mechanical signals in soft media using stored elastic energy. PNAS, vol. 113, No. 35, Aug. 30, 2016, pp. 9722-9727.

*Primary Examiner* — Adam D Houston
(74) *Attorney, Agent, or Firm* — Harness, Dickey & Pierce, P.L.C.

(57) ABSTRACT

The present disclosure relates to a micromechanical displacement logic, signal propagation system that makes use of first and second bistable elements, and first and second mounting structures arranged adjacent opposing surfaces of the first bistable element. A plurality of pivotal lever arms are used to support the first bistable element in either one of two positions of equilibrium. A support structure and a compressible flexure element disposed between the support structure and the first mounting structure apply a preload force to the first mounting structure, which imparts the preload force to the first bistable element. The first bistable element is moveable from one of the two stable equilibrium positions to the other in response to an initial signal applied thereto. The preload force, at least one stiffness characteristic of the lever arms, and a compressibility of a compressible coupling element which links the second bistable element to the first, are all selected to tune signal propagation from the first bistable element to the second bistable element.

19 Claims, 6 Drawing Sheets

(56) References Cited

U.S. PATENT DOCUMENTS

| | | | |
|---|---|---|---|
| 10,530,995 B2* | 1/2020 | Douady-Pleven | H04N 9/643 |
| 10,698,544 B2* | 6/2020 | Staszak | G06F 3/0488 |
| 2010/0102972 A1* | 4/2010 | Middlekauff | G08B 21/06 340/576 |
| 2013/0162016 A1* | 6/2013 | Lajoie | B62D 55/244 305/178 |
| 2013/0321675 A1* | 12/2013 | Cote | H04N 9/64 348/242 |
| 2013/0322752 A1* | 12/2013 | Lim | G06T 5/20 382/167 |
| 2015/0309071 A1* | 10/2015 | Proksch | G01Q 60/32 850/1 |
| 2017/0140617 A1* | 5/2017 | Klein | G08B 5/222 |
| 2019/0351419 A1* | 11/2019 | Fujita | G01N 35/00584 |

* cited by examiner

SYSTEMS AND METHODS FOR MICROMECHANICAL DISPLACEMENT-BASED LOGIC CIRCUITS

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to micromechanical elements which can be used to form logic gates, and more particularly to systems and methods for forming logic circuits which are tunable in their response sensitivity to propagating signals along a plurality of nodes formed by sequentially coupled bistable elements.

BACKGROUND

The statements in this section merely provide background information related to the present disclosure and may not constitute prior art.

It is presently very difficult to create sensors that can observe the environment for an extended period of time, then reliably respond to a specific state change event such as a temperature rise, pressure change or combination of signals. While electronic sensors can do this, the supporting equipment including power sources can dominate the size and the ultimate reliability of the device. Electrically powered sensors typically require DC batteries to provide the needed electrical power to sustain their operation, and the DC batteries can run out of power.

It would be extremely helpful for various applications, for example for food and product identification, if a passive technology such as RFID (Radio Frequency Identification) tags could be employed to monitor environmental conditions and register complex environmental changes that occur to the tagged item. This would also be highly useful for defense purposes. A passive sensor that could be designed (i.e., "keyed in") to respond to a certain set of environmental stimuli with a stored state change could then discern whether objects had been moved or passed through a certain location or environment. Still further, such a passive sensor could be used simply to confirm that a tagged item or object is in fact the same item or object that was initially tagged. This ability to detect movement/tampering of a sensor-tagged object would be especially helpful and valuable if the sensor could be made sufficiently small so that it is nearly indiscernible on the object of interest after it is attached to the object of interest.

SUMMARY

This section provides a general summary of the disclosure, and is not a comprehensive disclosure of its full scope or all of its features.

In one aspect the present disclosure relates to a micromechanical displacement logic, signal propagation system. The system may comprise a first bistable element, a first mounting structure arranged adjacent a first surface of the first bistable element, and a second mounting structure. The second mounting structure is arranged adjacent a second surface of the first bistable element, wherein the second surface opposes the first surface, and such that the bistable element is disposed between the first and second mounting structures. A support structure is also included, as is a compressible flexure element. The compressible flexure element is disposed between the support structure and first mounting structure to apply a preload force to the first mounting structure. A plurality of lever arms is included for supporting the bistable element between the first and second mounting structures in either one of two stable equilibrium positions, and applying the preload force to the bistable element. The bistable element is moveable from one of the two stable equilibrium positions to the other in response to an initial signal applied thereto. An additional movably supported element is included along with a compressible coupling linkage element. The compressible coupling linkage element is coupled at a first side to the first bistable element and at a second side to the movable supported element. A preload force applied to the plurality of lever arms, a stiffness characteristic of the lever arms, and a compressibility of the compressible coupling element, all control signal propagation from the bistable element to the movable element.

In another aspect the present disclosure relates to a micromechanical displacement logic, signal propagation system. The system may include a first bistable element, a first mounting structure arranged adjacent a first surface of the first bistable element, and a second mounting structure. The second mounting structure is arranged adjacent a second surface of the first bistable element, wherein the second surface opposes the first surface, and such that the bistable element is disposed between the first and second mounting structures. A support structure and a compressible flexure element are also both included. The compressible flexure element is disposed between the support structure and first mounting structure to apply a preload force to the first mounting structure. A first lever arm is included for coupling the first surface of the first bistable element with the first mounting structure. A second lever arm is included for coupling the second surface of the first bistable element and to the second support structure. The first and second lever arms are generally incompressible and apply a compressive force to the bistable element depending in part on the preload force applied using the compressible flexure element, and such that the bistable element assumes either first or second laterally spaced apart equilibrium positions, and the first and second lever arms further operate as translation bearings. A second bistable element is included which is arranged laterally of the first bistable element. A compressible coupling linkage is included for coupling the second bistable element and the first bistable element. A stiffness ($K_t$) experienced by the first bistable element is influenced by the lever arms, the coupling linkage, an angle of the first lever arm relative to a reference axis, and a characteristic of the compressible coupling linkage are cooperatively configured to enable the second bistable element to be moved along with the first bistable element when the first bistable element is caused to move, in response to an initial signal, from one of the first or second equilibrium positions to the other. In this manner, the initial signal acting on the first bistable element is propagated to the second bistable element and causes movement of the second bistable element from a first position to a second position.

In still another aspect the present disclosure relates to a method for forming a micromechanical displacement logic circuit to propagate a signal. The method may comprise supporting a first bistable element using a plurality of pivotal lever arms from a spaced apart pair of mounting structures.

The method may further include applying a predetermined preload force to the first bistable element through the pivotal lever arms such that the first bistable element is displaceable between first and second spaced apart positions of equilibrium. The method may further include coupling a second bistable element to the first bistable element using a compressible coupling linkage element. The method may further include using at least the predetermined preload force, a length of the lever arms, an axial stiffness of the lever arms, and a transverse stiffness of the lever arms, to control a sensitivity of the bistable element to movement in response to receiving an applied signal thereto. In this manner, propagation of the applied signal to the second bistable element is controlled.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
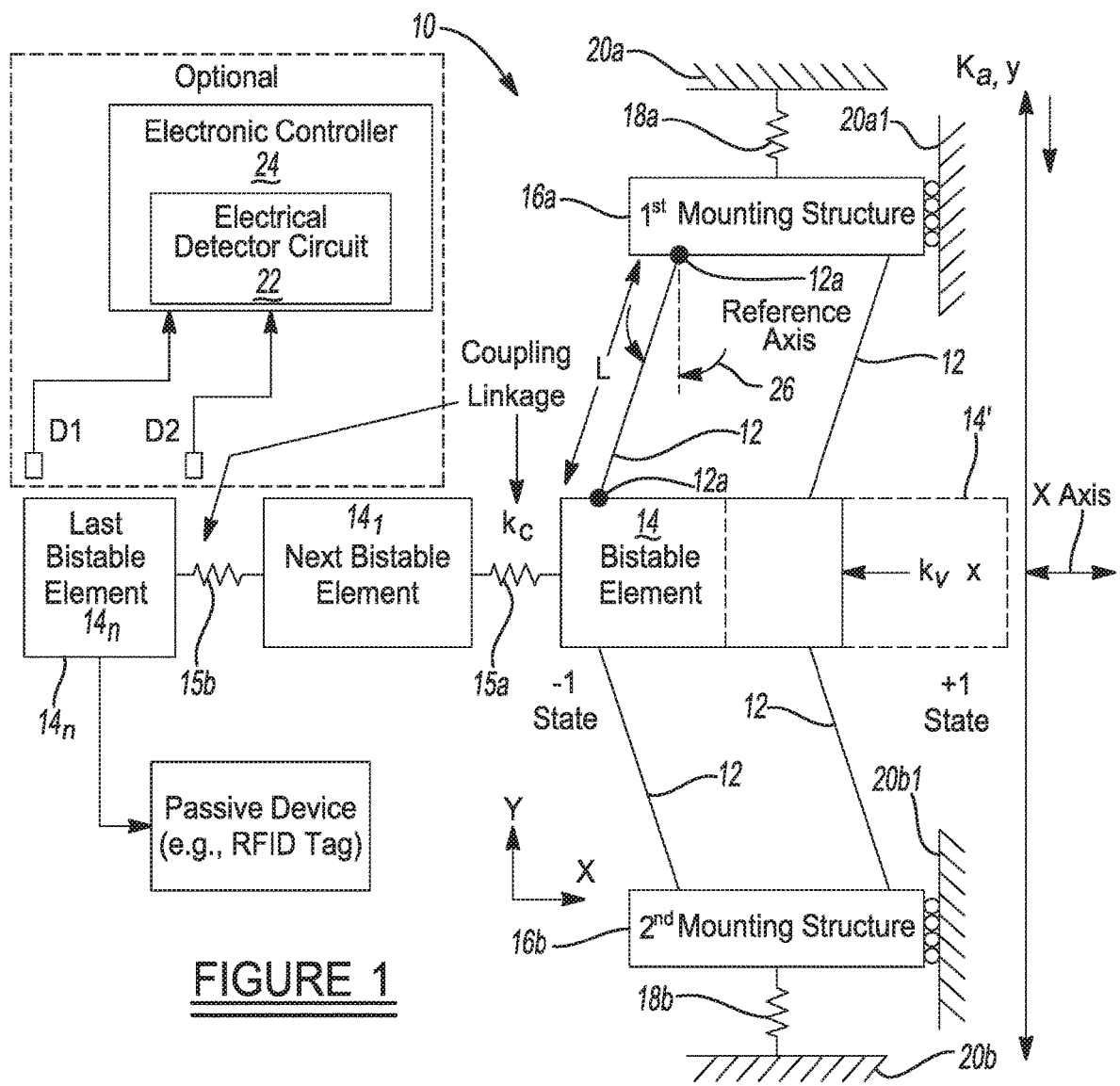
FIG. 1 is a simplified diagrammatic view of a bistable sensor having two stable positions, in accordance with one embodiment of the present disclosure.

Example embodiments will now be described more fully with reference to the accompanying drawings.

The present disclosure is directed to systems and methods for constructing micromechanical displacement logic. Such systems and methods are expected to provide highly useful capabilities for environmental sensing as the scale of the logic employed by such devices is small enough that unpowered sensors, such as thermal expansion sensors or chemical absorption sensors, are sufficient to reach the threshold energy required to generate signals. This makes the micromechanical displacement logic devices of the present disclosure able to act on multiple transduced environmental signals to provide a digital output.

Such systems employing sensors in accordance with the present disclosure are expected to have a number of important and valuable uses. For example, micromechanical displacement logic circuits of the present disclosure are expected to find utility in applications involving sensing the environments that the circuit has passed through. This is expected to be useful for tracking the status of critical equipment or foods. The logic circuits of the present disclosure are also expected to find utility in sensing rare environmental events, such as specific combinations of vibrational signals, by re-settably changing their state upon observing/experiencing a predefined event. This is expected to be useful for health monitoring in industrial or automotive equipment. Such a sensor of the present disclosure could also be keyed in to only respond to a specific set of target environmental variables, thus acting as a multi-domain, micromechanical lock (MML). For instance, if the proper temperature, magnetic field and vibrational frequency is applied, then the lock changes state. Such a lock could then be used to perform a desired action, such as closing an electric circuit, allowing for a miniature antenna to start operating. Although the effect of the antenna would likely be discernable via external sensors, such sensing circuits constructed in accordance with the present disclosure, which may be on the order of only microns in size, would be essentially undetectable and tamper proof due to their very small scale size. Such sensors would also be nearly unbreakable due to the large range of possible environmental stimuli that they could be constructed to operate with. Environmental stimuli like temperature cannot be rapidly changed, making it very difficult to break the lock, on top of the challenge of finding the extremely small scale lock itself on the object. MMLs may be used to validate the authenticity of the objects they are associated with, especially so if the MMLs are printed onto their associated object. This would be useful in various disciplines, for example with medicine, art, luxury goods or other objects.

MMLs may be created with three elements: 1) signal propagation structures; 2) logic AND gates; and 3) transducers. Logic AND gates are disclosed in corresponding U.S. application Ser. No. 16/178,690, "Systems For Mechanical Logic Based on Additively Manufacturable Micro-Mechanical Logic Gates", to Pascall et al., filed Nov. 2, 2018, which is assigned to the assignee of the present disclosure and incorporated herein by reference into the present disclosure. The present disclosure addresses signal propagation structures and transducers as well as possible system uses.

Design of Elements for Signal Propagation

The present disclosure provides a circuit/sensor which is able to propagate signals. These are defined as a "flip" (i.e., toggle) from the −1 to the +1 state or vice versa. It is desired that the signal pulse for either polarity change (i.e., from +1 to −1, or from −1 to +1) be able to propagate equally well down the mechanical logic chain. This is defined as a "bipolar" circuit/sensor design: one which can propagate signal pulses of either polarity. If this symmetry is broken, then the logic can only work in one direction polarity and becomes significantly more limited in its operation. The propagation is unidirectional, from the information source to the information sink. Other prior sensor designs have shown the capability to work in one direction, but because of asymmetry these cannot reset themselves after the initial signal (for example, see "*Stable Propagation of Mechanical Signals in Soft Media Using Stored Elastic Energy*," Raney et al., PNAS, v 113, no. 35, Aug. 30, 2016). Resettable 'bipolar' and unidirectional logic must satisfy degeneracy at the element level, meaning the +1 and −1 states for each bistable element are at the same potential energy. In this case, the signal pulses see equivalent conditions for switching in either direction, that is from −1 to +1 or from +1 to −1. The bistable element requirement for degeneracy is met by a symmetric device. This produces an equivalently distorted and loaded structure for both the −1 and +1 states.

Referring to FIG. 1, a bistable element 14 forming a portion of an overall system 10 in accordance with one embodiment of the present disclosure is shown which meets the above mentioned requirements of a symmetric device. The system 10 employs one or a plurality of logical elements or "gates", which are formed in part by the bistable elements 14, $14_1$ through $14_n$, which are able to propagate signals from one bistable element 14 to the next adjacent bistable element. These logic gates formed using the bistable elements 14 can be defined by several parameters, and in this example by five specific parameters. First, the characteristic length of a bistable element lever arm, "L" (labelled as element 12) is taken into consideration. The system 10 in this example employs four such lever arms 12, each of which may be thought of as a generally flexible plate or beam or 'flexure'. More complex flexible elements can be used which act equivalently to a flexible beam, the drawing uses the simple approximation of a beam for introductory purposes. Each lever arm 12 may be made from metal, ceramics, or any other suitable material. Each lever arm 12 is coupled at one distal end to one side of the bistable element 14 and at its opposite distal end to one or the other of separate mounting structures 16a or 16b. Accordingly, the bistable element 14 is supported by at least two lever arms 12, one on each opposing side, but even more preferably by four or more lever arms 12, with two being on each side of the bistable element. The lever arms 12 each essentially form translation bearings which pivot at both opposing ends, as indicated at points 12a, to permit lateral movement (i.e., left to right, and right to left in FIG. 1) of the bistable element 14 relative to the mounting structures 16a and 16b supporting it. As such, the flexure lever arms 12 may also be thought of as "pivot" levers because they pivot with respect to their associated mounting structure 16a or 16b and the bistable element 14. The "transverse" stiffness of the lever arms 12 is the resistance of the lever arms to forces that are perpendicular to the long axis of the lever arms. Specifically this refers to forces and displacements along the 'x' axis as seen in FIG. 1. The 'axial' stiffness of the lever arms 12 is the resistance of the lever arms to forces that are aligned to the long axis of the lever arms. Specifically this refers to forces and displacements along the 'y' axis as seen in FIG. 1.

The mounting structures 16a and 16b may each be coupled via a compressible flexure element 18a and 18b to separate support structures 20a and 20b, which in this example are fixed against movement. The fixed support mounting components 20a and 20b are each guided via bearings 20a1, 20b1, to only allow sliding movement (in the vertical axis in FIG. 1). The axial stiffness of the vertical bearing is set by 18a and 18b. This stiffness can be understood as the displacement response when force is applied to bring separate support structures 20a and 20b towards one another.

As shown in FIG. 1, the system 10 in this embodiment also includes additional bistable elements $14_1$ through $14_n$, each one coupled to the next by compressible coupling linkage elements 15a, 15b and so forth, depending on how many independent bistable elements are incorporated in the system 10. While three bistable elements 14, $14_1$ and $14_n$ are shown in FIG. 1, the system 10 may include only one, or optionally more than three, such bistable elements 14, and is therefore not limited to use with any fixed number of bistable elements. As will become apparent in the following paragraphs, a significant advantage of the system 10 is that it can be constructed to incorporate virtually any number of bistable elements 14, for example tens, hundreds or even thousands of such independent elements to suit specific applications.

The system 10, in one embodiment, forms an entirely passive system requiring no DC or AC power for its operation. The movement of any one of the bistable elements 14 in the chain of bistable elements, in this example bistable element $14_n$, may be used to control, at least in part, some operation of a larger device or component that the system 10 is being used with. For example, movement of the last bistable element $14_n$ in this example may be used to control a feature of a device or component, which in one embodiment may be a passive device, for example a radio frequency identification (RFID) tag. The controlled feature may be controlling a conductive path of the RFID tag to control some aspect of operation of the RFID, such as its inductance. Optionally, sensors D1 and D2 could be used to detect the movement (e.g., through physical contact or other means) and feed a corresponding signal to an electrically powered detector circuit 22, which may also form a portion of a larger electronic controller 24. Accordingly while the system 10 is ideally suited for miniature devices and components that do not require a DC or AC power source, the system 10 is readily usable with other types of components and systems where DC and/or AC power is available.

In FIG. 1, the length "L" of each lever arm 12 in this example defines the distance of each lever arm 12, or put differently the distance between the two pivot points, forms what may be viewed as a "translation bearing" for the bistable element 14. Second, the non-dimensional ratio Y of the bistable element 14a compression, y, divided by L is considered. This captures the scale of loading required to store energy into the bistable element 14 and make it operate as a bistable structure. Third, the non-dimensional ratio $K_t$ of the transverse stiffness of the translation bearing (i.e., lever arm 12) divided by the axial stiffness of the vertical bearing 18a and 18b is considered. Fourth, the non-dimensional ratio $K_c$ of the coupling stiffness linking the bistable elements 14, $14_1$, $14_n$, divided by the vertical bearing 18a and 18b, is considered. And fifth, the axial stiffness, $k_a$, of the vertical bearing 18a and 18b is considered. FIG. 1 shows the bistable element 14 in solid lines in the −1 position (i.e., one stable position), and with dashed lines 14' in the +1 position (i.e., the other stable position).

Within the set of five parameters described above, there may be many possible designs, however only a subset of these will be suitable for reliable signal propagation from one bistable element 14 to an adjacently coupled bistable element (or elements). The design space is mainly set by the variables Y, $K_t$, and $K_c$. The variables L and $k_a$ set the scale of size and energy storage without altering the propagation capabilities of the bistable element 14. The Y value needs to be set roughly 0.1 or higher. Y describes the scale of preload force, and thus the scale of linear displacement in the two equilibria (i.e., the scale of horizontal displacement in FIG. 1), which is possible for the bistable element 14. A small value of Y nonlinearly reduces the energy storage in the system 10 (i.e., in the bistable element 14), which can result in the energy storage dropping very quickly below a stable threshold. A low energy barrier between discrete states causes the bistable element 14 to undergo unwanted transitions between the −1 and +1 states, and possibly find more than the desired two equilibria. Both of these conditions are unacceptable in binary logic operations. The Y values significantly above 0.1 tend to be very difficult to achieve with flexible linkages. The Y value directly maps to the angle of the linkage (denoted by reference number 26 in FIG. 1, which is parallel to the y axis) at equilibrium, which determines the maximum angle of rotation required for the lever arms 12 (which form the linkage joints between the bistable element 14 and the support structures 16a and 16b). At roughly $Y=1-2^{-0.5}$, the angle 26 corresponds to 45 degrees. The Y scale of displacement compression sets the potential energy well for the design of the system 10. Values significantly below 0.1 significantly drop off the potential energy well scale, reducing element stability while the bistable element 14 is in its bistable equilibrium well.

Angle Variation with Y (Preload Displacement)

Figure 2:
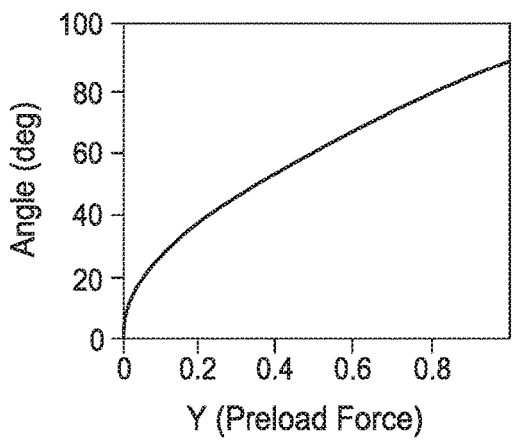
FIG. 2 is a graph illustrating angle variation (in degrees) as a result of a change in the variable Y, where Y describes the scale of pre-load acting on the bistable element, and thus the scale of displacement in two equilibria possible for the bistable element.
Figure 3A:
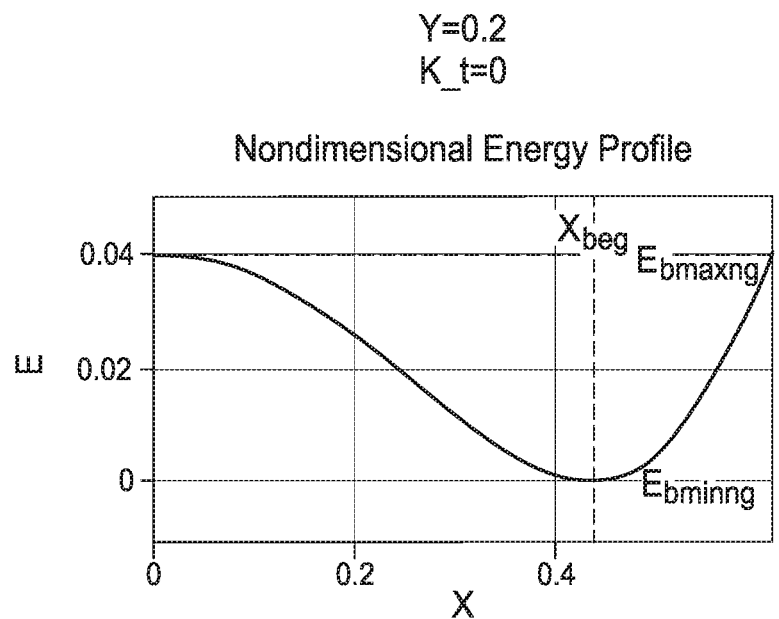
FIGS. 3a-5c show graphs of energy, force and stiffness affecting the bistable element of FIG. 1 in response to variations as $K_t$ (stiffness of the pivot levers holding the bistable element in FIG. 1), from conditions where Y (displacement of the mounting structure of FIG. 1) changes from 0Y, to Y to 2Y.
Figure 3B:
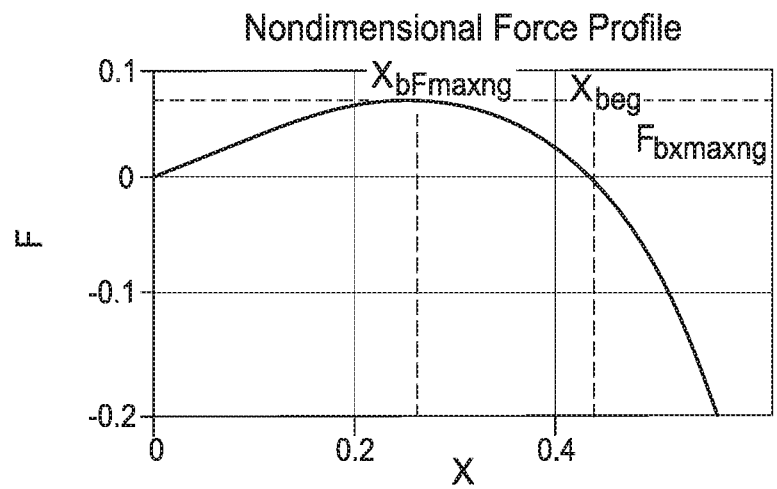
Figure 3C:
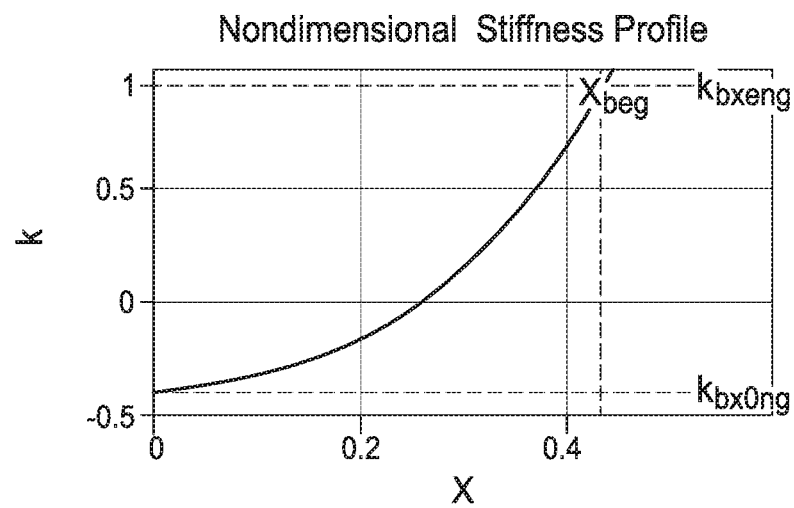
Figure 4A:
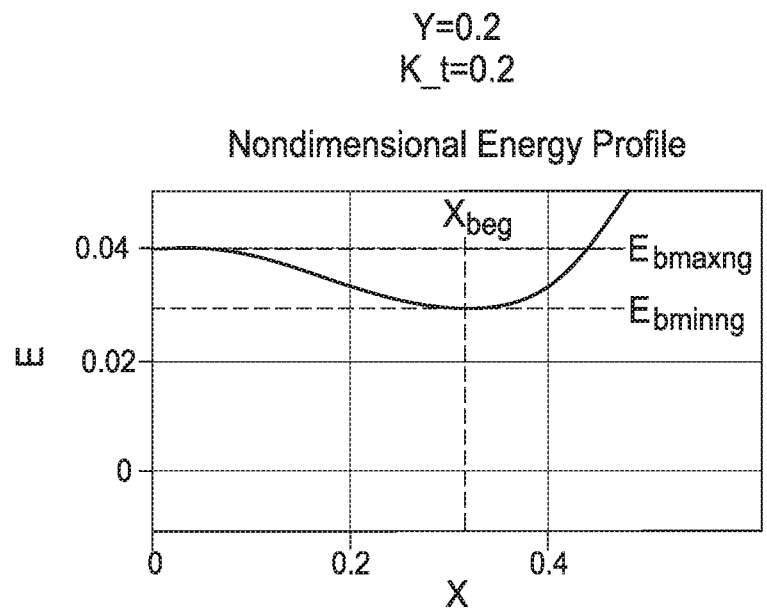
Figure 4B:
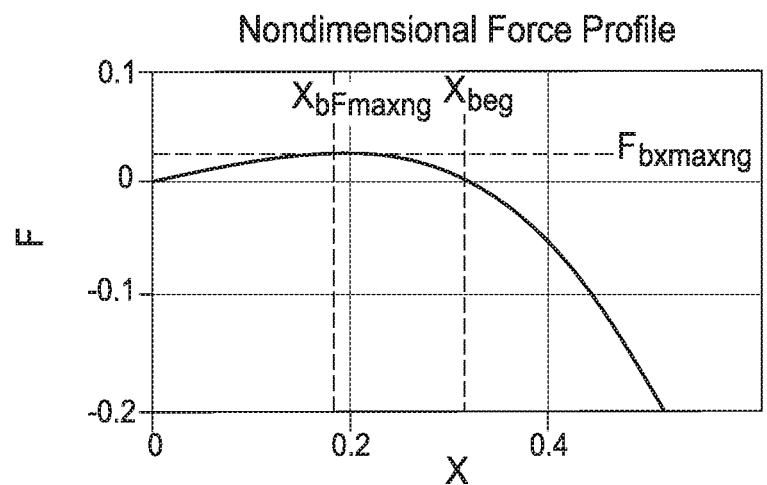
Figure 4C:
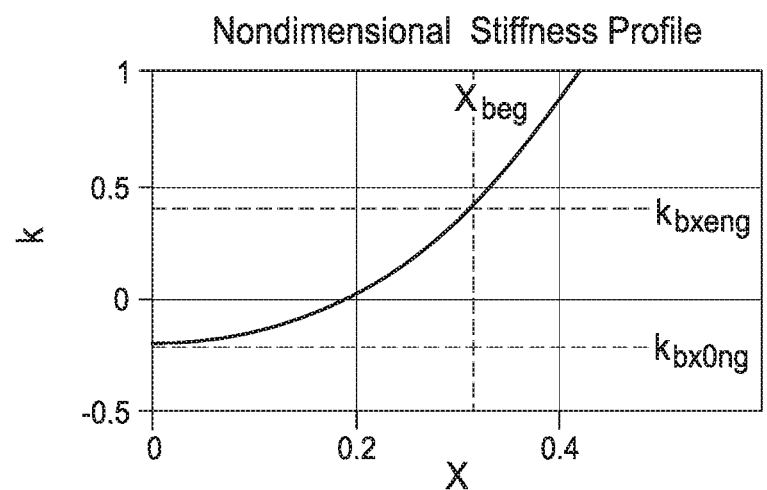
Figure 5A:
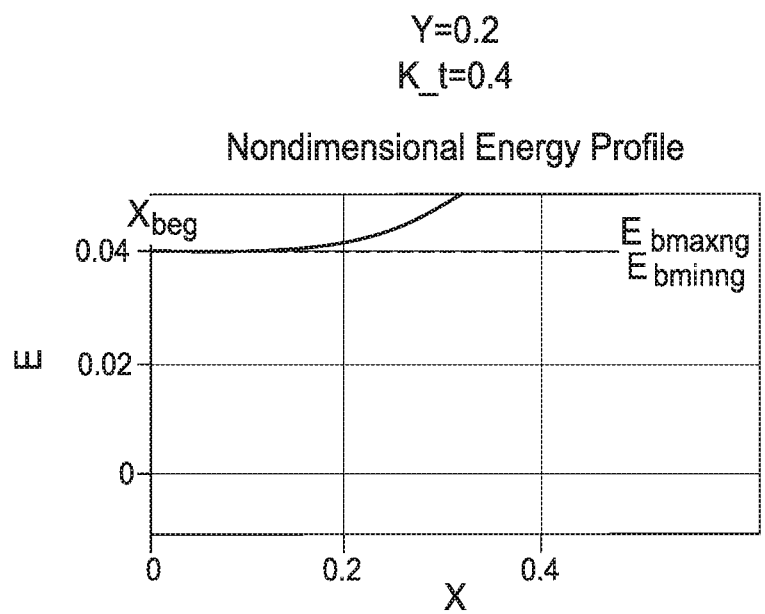
Figure 5B:
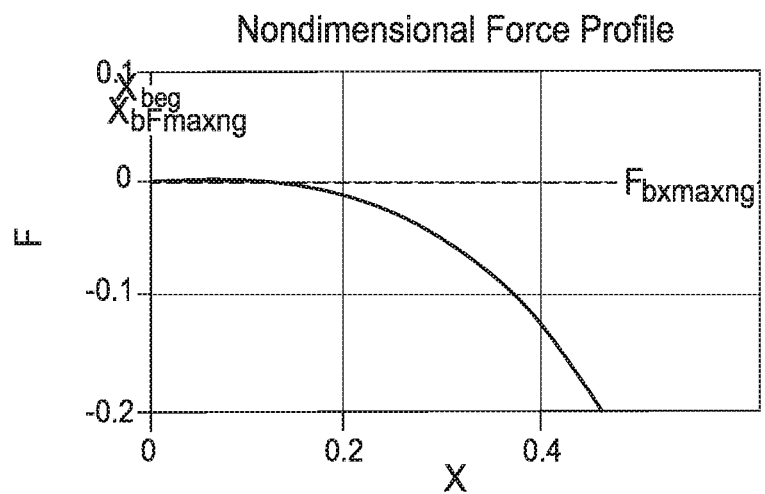
Figure 5C:
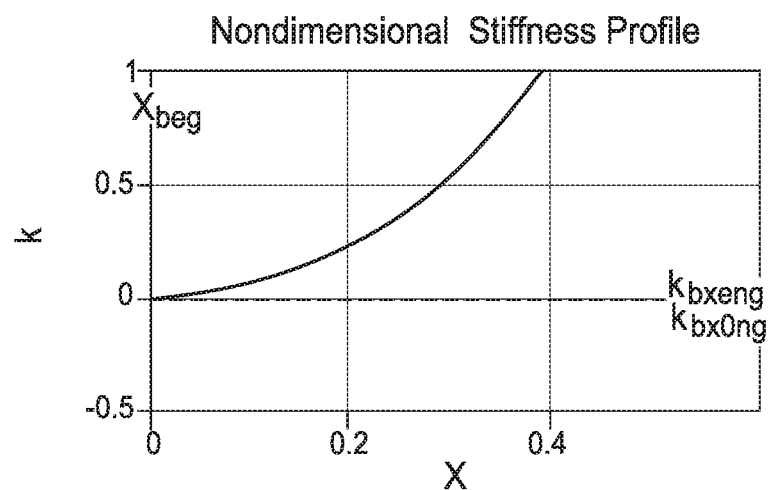

With reference to FIGS. 1 and 2, the Kt variable is essentially a stiffness or strength of the bistable element 14 at resisting linear movement in response to the Y preload force. $K_t$ is controlled by how strongly the lever arms 12 resist horizontal movement (along the X axis in FIG. 1) and has a strict upper bound, which generally determines its value since design tradeoffs suggest it should be set high. The $K_t$ value needs to be set less than 2*Y. The transverse stiffness $K_t$ directly reduces the potential energy wells generated by the compressed structure (i.e., the bistable element 14) with a set $k_a$ value. Too high of a transverse stiffness entirely erases the potential energy wells that enable bistability of the bistable element 14. This threshold value is 2Y. The $K_t$ value should then be kept below 2Y. As a countering demand, it is desired to keep $K_t$ large, roughly on the order of 1, so that the transverse stiffness is in the same rough scale as the axial stiffness. Keeping the transverse and axial stiffnesses on the same order of magnitude makes it easier to create a compact configuration for the system 10. If one stiffness is 100× or more off the others, then the flexures (e.g., elements 12, 15, 18) required to create that stiffness will be far larger than the other elements and will dominate the whole design scale. It will also be difficult to ensure the ideal behavior of a bistable element with vastly different scales of stiffness. When the bistable element 14 is compressed to store energy in it and settles into a bistable state, the axial stiffness sets the rough scale of compressive force. The transverse stiffness $K_t$ sets a rough scale for transverse force. If these are of significantly different orders of magnitude, for instance the axial force $k_a$ is much higher due to $K_t \ll 1$ then the bistable element 14 lever arms 12 are liable to buckle, with the center stage (i.e., the initial bistable element 14) not shifting into the bistable equilibria but rather out of plane and at an angle (i.e., not parallel to the horizontal axis). Such buckling ruins the capability of the bistable element 14 to act in the desired digital fashion. If $K_t$ is kept large, then a high transverse stiffness is allowed for flexures 12 and the bearings in the lever arm 12 linkage can be made stiffer to resist the non-linear non-ideality of buckling. However if $K_t$ is placed directly at the maximum value of 2Y, then the system will show no bistability. The recommended value is therefore roughly half of the maximum value of 2Y, or in other words Y. This balances between competing demands on $K_t$.

Energy, Force and Stiffness Variation as $K_t$ Changes from 0Y to Y to 2Y

Referring to FIGS. 3a-5c, the $K_c$ value can be seen to control the shape of a pulse which will propagate through the chain of bistable elements 14, assuming two or more of the bistable elements 14 are used in the system 10. The value of $K_c$ sets the shape of the pulse via a non-dimensional ratio comparing $K_c$ to the characteristic stiffness of the bistable element in the bistable equilibrium region, $K_{bFmax}$. The characteristics stiffness of the bistable element is defined by the maximum return force generated by the bistable element 14, which is defined by $F_{bmax}$, divided by the off-center x-axis location at which this maximum force occurs, $x_{bFmax}$. $K_{bFmax}$ is then defined by this characteristic stiffness divided by $k_a$. If $K_{bFmax}$ is compared to $K_c$, then an accurate metric is generated for understanding how the pulse structure will form. This metric is $r_{kPulse}=K_c/K_{bFmax}$. The metric is useful because the traveling signal pulse will settle into a shape that balances all forces between nodes (i.e., between the bistable elements 14), and the shape will be strongly dependent on how stiff the couplings 15a, 15b, etc., between bistable elements 14 are. If they are very stiff, then each bistable element 14 $14_1$, $14_n$ is forced to very near the same state as the one next to it. The S-shaped pulse will then be very wide. But if $K_c$ is low, then a large amount of relative displacement is possible between adjacent nodes and the pulse can be small, down to a just few nodes (i.e., just a couple of a much larger number of bistable elements 14 interconnected by coupling elements 15a, 15b, etc.). The value of $K_c$ thus shapes the pulse as well as several other parameters. The pulse size sets the scale of energy injection required to initiate a pulse that changes the state of the bistable elements of the chain as it passes through them, so lower tends to be better.

Figure 6A:
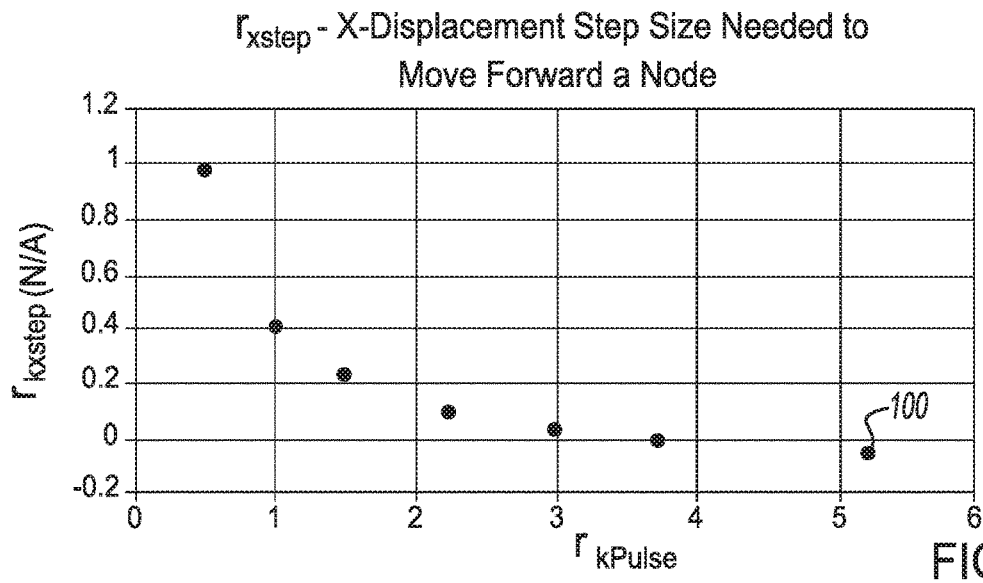
FIG. 6a shows the X displacement step size needed to move forward one node (i.e., one bistable element)
Figure 6B:
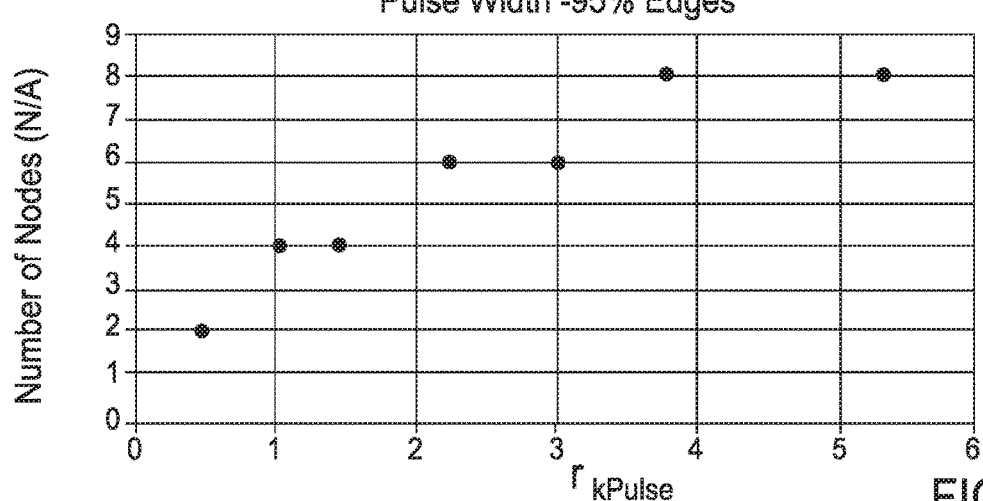
FIG. 6b shows a pulse width representing the number of nodes that are disturbed.
Figure 6C:
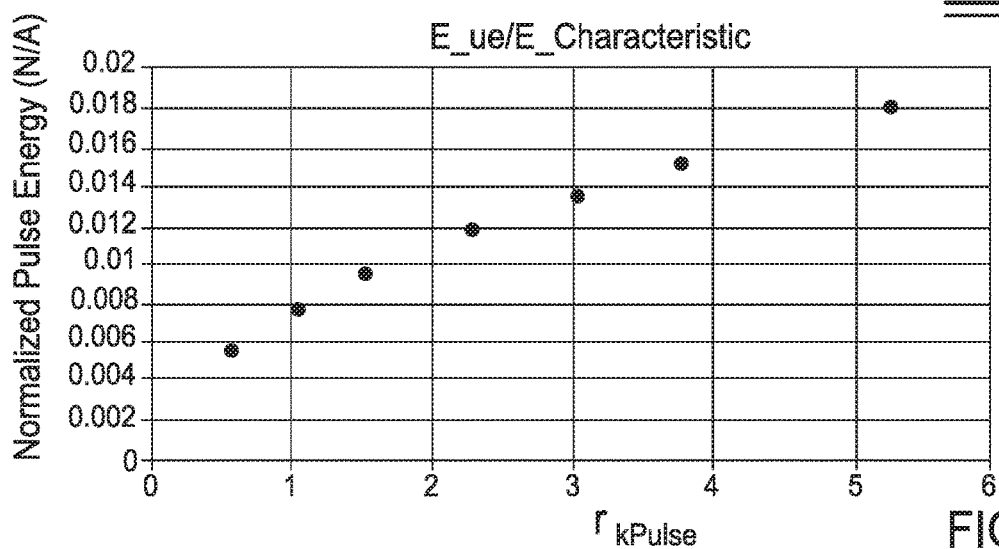
FIG. 6c shows the normalized pulse energy vs. $r_{kPulse}$ which illustrates that each node (i.e., each bistable element) has to store slightly less energy than the previous node for signal propagation to occur.

With further reference to FIGS. 4a-5c, the pulse size also sets the difference between the pulse potential energy as it transitions from being centered on a node (i.e., on the bistable element 14) to being centered on the linkage between nodes (between two of the bistable elements 14). These two states each have a distinct potential energy. If they are the same, then the pulse will travel smoothly down a chain of a plurality of interlinked bistable elements 14. If the state potential energies differ, and they always will, then this creates potential energy wells in the propagation path that will halt the pulse if it drops below a threshold kinetic energy value. The scale of the potential energy wells, or 'traps' is set by $r_{kPulse}$. Higher values of $r_{kPulse}$ will drive down the trap scale, while lower values will increase the trap scale. A lower bound exists for $r_{kPulse}$ at a value of ½. At very low values, $K_c$ becomes too compliant, and raising one bistable element 14 from the −1 state to the +1 state does not generate enough force to pull (i.e., transition) the next bistable element 14 to the other equilibrium position. This is shown in FIG. 6a, where the step size required to pull the next node (i.e., the next bistable element $14_1$) through the central unstable equilibrium is normalized to the equilibrium displacement at the +/−1 states. At this point of $r_{kPulse}=\frac{1}{2}$, the pulse cannot propagate cleanly. An upper bound exists for $r_{kPulse}$, which is $r_{kPulseMax}$, where multiple nodes are pulled over the peak force threshold simultaneously, causing the size of the pulse to expand and the energy in the pulse to rise. This is shown in FIG. 6a where $r_{xstep}$ drops below 0 (at point 100). While a pulse can be constructed in this regime, it asymptotically approaches a design where the coupling stiffness is so high all the bistable elements 14 are simultaneously driven together. Such a design requires an unbounded scale of force to drive a state change, since all bistable elements in a chain of arbitrary length must be driven simultaneously. The size of the pulse increases as $r_{kPulse}$ rises (FIG. 6b) as does the energy stored in the pulse (FIG. 6c). The desired mode of operation is a short, relatively low energy pulse that propagates down the chain rather than driving all bistable elements in the chain up simultaneously. The recommended pulse design in one embodiment of the system 10 makes use of an $r_{kPulse}$ value between ½ and $r_{kPulseMax}$, which is tuned to the specific design needs of the application, device or component that the system 10 is incorporated in. As such, this may be small pulse size or it may be long distance pulse propagation, depending on the application, device or component needs. Accordingly, the above instructions will define the stiffnesses needed to make a bistable element 14 which can correctly propagate signals.

Design of Chains of Bistable Elements for Signal Propagation

In a practical application, the bistable elements 14 and couplings 15 should be carefully designed to enable both stable operation and the needed signal propagation through the bistable elements. Thus, the system 10 should be designed considering the above variables in a manner to ensure responsive and reliable signal propagation. There are two ways for the desired binary 'digital' signal to propagate. The first is a non-equilibrium approach. The second is an equilibrium approach.

The non-equilibrium approach relies on kinetic energy to overcome the stability of a plurality of the bistable elements 14 linked together in a chain and to propagate a signal pulse. The pulse is supplied with a single large reservoir of kinetic energy by rapidly moving the initial bistable element 14 in the chain. This is equivalent to giving the first node a swift hit. The pulse kinetic energy is then drained through damping as the pulse propagates through each bistable element 14 and each coupling 15 in the chain. This pulse can typically travel a few links (i.e., elements) into the chain before the kinetic energy falls below the threshold required for activating the next bistable element.

The equilibrium approach relies on a distributed source of energy to drive the pulse. While each bistable element 14 in the chain will satisfy the degeneracy condition, the whole chain need not satisfy this condition. Bipolar operation requires energy degeneracy within the single bistable element. Unidirection signal propagation is an asymmetric requirement and thus allows for the chain to be likewise asymmetric. An asymmetric chain can be designed to produce stable equilibrium signal propagation over great lengths. This is done by having each successive bistable element store slightly less potential energy than the previous element. Then as the signal propagates down the chain of bistable elements 14, the stored potential energy is gradually converted to kinetic energy. This continual supply of kinetic energy provides the motive source for the signal, as the small kinetic energy packets supplied by each bistable element 14 balance against the damping energy loss on the signal to create a steady state velocity for the signal pulse. The equilibrium approach can be used to propagate the signal until the signal energy reaches a minimum threshold such as 10% of the initial value, or even 0%. Each bistable element 14 has remained degenerate so the system can work equally well to unidirectionally propagate a signal of either polarity (−1 to +1 or +1 to −1).

Figure 7:
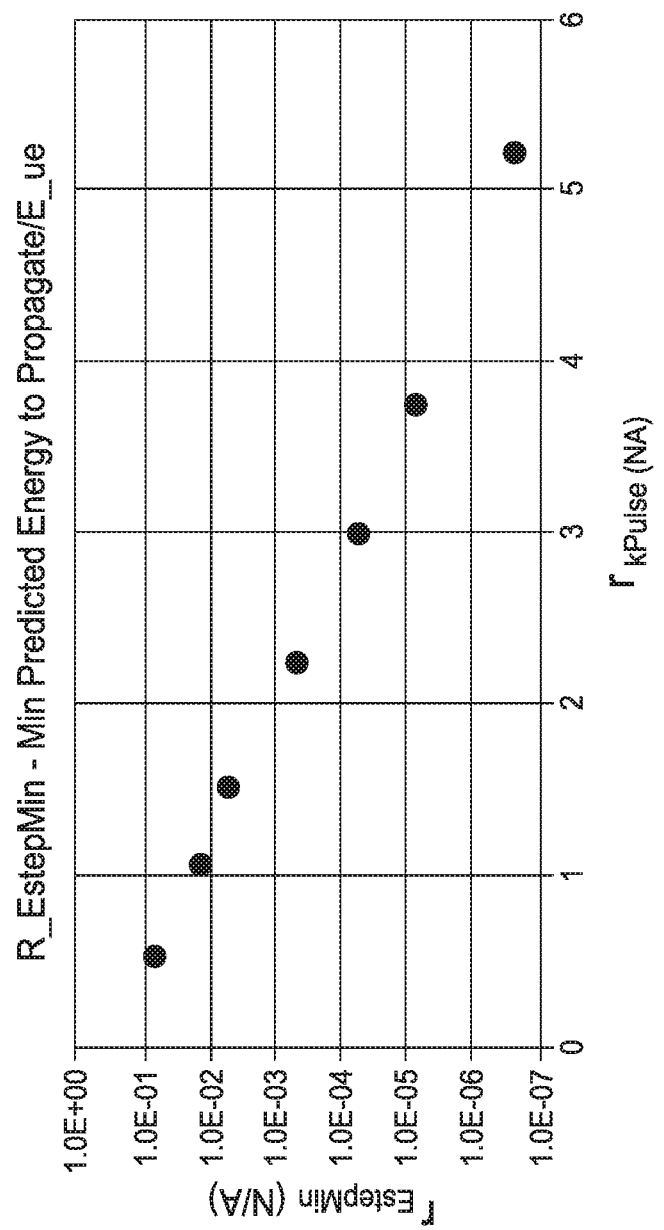
FIG. 7 shows a plot of minimum predicted energy that has to be lost, at each node, for the signal pulse to be propagated to the next node (i.e., to the next bistable element).

The critical threshold to ensure equilibrium propagation is the minimum potential energy reduction between successive bistable elements needed to keep the pulse going. If the energy step is too small, then the pulse will get caught between two bistable elements 14. The signal pulse can be tracked as it passes from being centered on the first bistable element 14 (i.e., a 'start') to being centered on the following bistable $14_1$ element (which be a 'finish'). The potential energy of the pulse during this transition can be measured. This forms a potential energy map for understanding pulse propagation. The pulse structure as it passes between elements falls to a lower energy state, resulting in a potential energy map with a sinusoidal shape where both 'start' and 'finish' are maximums. This potential energy trap can catch the pulse if it does not have sufficient kinetic energy. The depth of the energy trap is set by $r_{kPulse}$. Large values of $r_{kPulse}$ drive the energy trap down, smoothing out the potential energy surface, as shown in FIG. 7. Low values of $r_{kPulse}$ make the energy trap deeper. The pulse kinetic energy at the 'start' must be sufficient to propagate the pulse through the energy trap and reach the 'finish' (i.e., the last bistable element in the chain). If the potential energy of the 'finish' bistable element is slightly decreased, then this tilts the potential energy map downward, making it easier for the pulse to reach the 'finish' point. More potential energy is passed to the pulse as kinetic energy and the barrier scale at the 'finish' point is reduced. Both act to aid the pulse in reaching the 'finish' point.

The minimum energy step between bistable elements 14 (i.e., between nodes) can be calculated via the potential energy map. As a design rule, the actual decrement should be greater than this minimum value to ensure the propagation is not halted by small manufacturing errors. Once this decrement is calculated for each successive element in the chain, the design of each element in the chain can be modified to set the degenerate energy scale of that element to the target value. While there are many way to set the bistable element degenerate energy scale, a recommended method is to adjust only $k_a$. If all other parameters are held constant, then the pulse shape will be stable while it propagates down the chain of bistable elements.

Signal Transduction

For instance, such circuits could act as thresholding measurements, and when combined with an AND gate, such a system could be tuned to sharply respond at only one environmentally transduced value. If one transducer is designed to push through a bistable element 14 once the environmental value reaches a certain threshold, it can be combined with one that pulls back an element once a higher value is reached. If an AND gate is used on both values, it will act as a sharp thresholding filter. Such thresholded inputs would let passive micromechanical logic respond to set values in the environment and do so across multiple domains.

These domains could include widely varying domains such as temperature, vibration, pressure, chemical concentration, DNA, magnetic field, electric field, optical intensity, and more. When the system 10 is constructed on a microscale level, transducers can be created for each to shift the environmental state into a linear displacement. A thresholding AND gate circuit may then only respond when the environmental stimuli reached a certain range of values. Passive circuitry can then be used to check for logical conditions being present. One example of a logical condition being present may be a target temperature and pressure being reached, such as might be found when a credit card is held using the fingers of a hand. The circuitry may then engage (i.e., respond by changing state), allowing the RFID tag on credit cards to know that the card is in use and not being targeted by an RF attack to pull (i.e., improperly read) the credit card information.

The output signal from the micromechanical logic would likewise need to be transduced to reach the macroscale. Several methods are possible for this, including activating a switch in an electric or photonic circuit, or transducing a physical distortion into a pulse of light. This can be done with triboluminescent materials, which transduce mechanical distortion into light. Such a passive light source could act as a useful signal to be captured by observing optics or to be sent down a fiber optic to a distant sensor if desired.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A micromechanical displacement logic, signal propagation system, comprising:
    a first bistable element;
    a first mounting structure arranged adjacent a first surface of the first bistable element;
    a second mounting structure arranged adjacent a second surface of the first bistable element, wherein the second surface opposes the first surface, and such that the first bistable element is disposed between the first and second mounting structures;
    a support structure;
    a compressible flexure element disposed between the support structure and the first mounting structure to apply a preload force to the first mounting structure;
    a plurality of lever arms for supporting the first bistable element between the first and second mounting structures in either one of two stable equilibrium positions, and applying the preload force to the bistable element, the first bistable element being moveable from one of the two stable equilibrium positions to the other in response to an initial signal applied thereto;
    an additional movably supported element; and
    a compressible coupling linkage element coupled at a first side to the first bistable element and at a second side to the movable supported element; and
    wherein a preload force applied to the plurality of lever arms, a stiffness characteristic of the lever arms, and a compressibility of the compressible coupling linkage element, control signal propagation from the first bistable element to the movable element.

2. The system of claim 1, wherein the additional movably supported element comprises an additional bistable element supported for translating movement along an axis in common with the first bistable element.

3. The system of claim 2, wherein the plurality of lever arms form first and second lever arms, and are generally incompressible and apply a compressive force to the bistable element depending in part on the preload force applied using the compressible flexure element, and such that the first bistable element assumes either one of the two laterally spaced apart equilibrium positions, and the first and second lever arms operate as translation bearings.

4. The system of claim 3, wherein propagation of the initial signal is influenced by a length "L" of each of the lever arms.

5. The system of claim 4, wherein propagation of the initial signal is influenced by a compression of the first bistable element divided by the length L of one of the lever arms, and wherein the lever arms are all of equal length.

6. The system of claim 5, wherein propagation of the initial signal is influenced by an axial stiffness $K_t$ of the lever arms.

7. The system of claim 6, wherein the axial stiffness $K_t$ comprises a non-dimensional stiffness, and wherein $K_t$ represents a traverse stiffness of the lever arms divided by the axial stiffness of the lever arms.

8. The system of claim 7, wherein propagation of the initial signal is further controlled by a non-dimensional ratio $K_c$, wherein $K_c$ is a coupling stiffness imparted by the coupling linkage linking the first and additional bistable elements, divided by the axial stiffness of the lever arms.

9. A micromechanical displacement logic, signal propagation system, the system comprising:
a first bistable element;
a first mounting structure arranged adjacent a first surface of the first bistable element;
a second mounting structure arranged adjacent a second surface of the first bistable element, wherein the second surface opposes the first surface, and such that the first bistable element is disposed between the first and second mounting structures;
a support structure;
a compressible flexure element disposed between the support structure and the first mounting structure to apply a preload force to the first mounting structure;
a first lever arm coupling the first surface of the first bistable element with the first mounting structure;
a second lever arm coupling the second surface of the first bistable element to the second mounting structure;
the first and second lever arms being generally incompressible and applying a compressive force to the first bistable element depending in part on the preload force applied using the compressible flexure element, and such that the first bistable element assumes either first or second laterally spaced apart equilibrium positions, and the first and second lever arms operate as translation bearings;
a second bistable element arranged laterally of the first bistable element;
a compressible coupling linkage coupling the second bistable element and the first bistable element; and
wherein a stiffness ($K_t$) experienced by the first bistable element is influenced by the lever arms, the coupling linkage, an angle of the first lever arm relative to a reference axis, and a characteristic of the compressible coupling linkage are cooperatively configured to enable the second bistable element to be moved along with the first bistable element when the first bistable element is caused to move, in response to an initial signal, from one of the first or second laterally spaced apart equilibrium positions to the other, such that the initial signal acting on the first bistable element is propagated to the second bistable element and causes movement of the second bistable element from a first position to a second position.

10. The system of claim 9, wherein propagation of the initial signal is influenced by a length "L" of each of the lever arms.

11. The system of claim 10, wherein propagation of the initial signal is influenced by a compression of the first bistable element divided by the length L of one of the lever arms, and wherein the lever arms are all of equal length.

12. The system of claim 11, wherein propagation of the initial signal is influenced by an axial stiffness $K_t$ of the lever arms.

13. The system of claim 12, wherein the axial stiffness $K_t$ comprises a non-dimensional stiffness, and wherein $K_t$ represents a traverse stiffness of the lever arms divided by the axial stiffness of the lever arms.

14. The system of claim 13, wherein propagation of the initial signal is further controlled by a nondimensional ratio $K_c$, wherein $K_c$ is a coupling stiffness imparted by the coupling linkage linking the first and second bistable elements, divided by the axial stiffness of the lever arms.

15. The system of claim 14, wherein the first bistable element has the same potential energy when positioned in either the first or second laterally spaced apart equilibrium positions.

16. The system of claim 15, wherein sensitivity to movement of the first bistable element between the first and second laterally spaced apart equilibrium positions is controlled in part by the preload force applied via the compressible flexure element;
wherein the preload force is designated by "Y"; and
wherein the preload force Y non-linearly influences a displacement of the first bistable element.

17. The system of claim 16, wherein:
a value of the preload force comprises a value of at least 0.1; and
a value of $K_t$ is less than 2*Y.

18. The system of claim 17, further comprising:
an additional support structure;
an additional compressible flexure element coupled to the additional support structure; and
third and fourth lever arms each coupled at one end to the bistable element and at an opposite ends to the first mounting structure and the second mounting structure.

19. A method for forming a micromechanical displacement logic circuit to propagate a signal, the method comprising:
supporting a first bistable element using a plurality of pivotal lever arms from a spaced apart pair of mounting structures;
applying a predetermined preload force to the first bistable element through the pivotal lever arms such that the first bistable element is displaceable between first and second spaced apart positions of equilibrium;
coupling a second bistable element to the first bistable element using a compressible coupling linkage element; and
using at least the predetermined preload force, a length of the lever arms, an axial stiffness of the lever arms, and a transverse stiffness of the lever arms, to control a sensitivity of the bistable element to movement in response to receiving an applied signal thereto, such that propagation of the applied signal to the second bistable element is controlled.

* * * * *